US010051725B2

(12) United States Patent
Kawazu

(10) Patent No.: US 10,051,725 B2
(45) Date of Patent: Aug. 14, 2018

(54) CIRCUIT BOARD, ELECTRONIC COMPONENT HOUSING PACKAGE, AND ELECTRONIC DEVICE

(71) Applicant: KYOCERA Corporation, Kyoto-shi, Kyoto (JP)

(72) Inventor: Yoshiki Kawazu, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 35 days.

(21) Appl. No.: 14/893,653

(22) PCT Filed: Oct. 29, 2014

(86) PCT No.: PCT/JP2014/078756
§ 371 (c)(1),
(2) Date: Nov. 24, 2015

(87) PCT Pub. No.: WO2015/064637
PCT Pub. Date: May 7, 2015

(65) Prior Publication Data
US 2016/0120026 A1  Apr. 28, 2016

(30) Foreign Application Priority Data
Oct. 30, 2013  (JP) ................................. 2013-225830

(51) Int. Cl.
*H05K 1/02* (2006.01)
*H05K 1/11* (2006.01)
(Continued)

(52) U.S. Cl.
CPC .......... *H05K 1/0246* (2013.01); *H01P 3/026* (2013.01); *H01P 3/081* (2013.01); *H01P 5/028* (2013.01);
(Continued)

(58) Field of Classification Search
CPC .............................. H04K 1/0246; H01P 3/026
(Continued)

(56) References Cited

U.S. PATENT DOCUMENTS 3,818,117 A * 6/1974 Reyner, II ............ H01B 7/0838
                                                 174/117 FF
8,274,307 B1 * 9/2012 Ben Artsi ............... H01P 3/026
                                                      326/30
(Continued)

FOREIGN PATENT DOCUMENTS

JP        2007-123744 A        5/2007
JP        2007-158856 A        6/2007
(Continued)

OTHER PUBLICATIONS

International Search Report, PCT/JP2014/078756, dated Dec. 16, 2014, 2 pgs.

*Primary Examiner* — Stephen E Jones
*Assistant Examiner* — Scott S Outten
(74) *Attorney, Agent, or Firm* — Volpe and Koenig, P.C.

(57) ABSTRACT

This circuit board includes a plate body made of a dielectric body and having a front surface and a back surface, a differential signal line formed on the front surface, the differential signal line being made of a pair of signal lines, and a ground conductor formed on the back surface. The signal lines include: terminals formed at a distance from the ground conductor, in an end portion at a prescribed distance from one end of the back surface; connection pads connected to the terminals and provided on the end portion of the front surface so as to be opposed to the terminals; transmission line units extending from the connections pads; and a widened portion provided in a position on the transmission line units corresponding to a space between the terminal and the ground conductor, the widened portion
(Continued)

having a line width greater than that of the transmission line units.

8 Claims, 6 Drawing Sheets

(51) Int. Cl.
| | |
|---|---|
| *H01P 3/08* | (2006.01) |
| *H05K 5/00* | (2006.01) |
| *H05K 1/18* | (2006.01) |
| *H01P 3/02* | (2006.01) |
| *H01P 5/02* | (2006.01) |
| *H05K 3/34* | (2006.01) |
| *H05K 3/36* | (2006.01) |

(52) U.S. Cl.
CPC ........... *H05K 1/025* (2013.01); *H05K 1/0245* (2013.01); *H05K 1/111* (2013.01); *H05K 1/18* (2013.01); *H05K 5/0069* (2013.01); *H05K 1/0253* (2013.01); *H05K 1/117* (2013.01); *H05K 3/3405* (2013.01); *H05K 3/363* (2013.01); *H05K 2201/09727* (2013.01); *H05K 2201/10189* (2013.01)

(58) Field of Classification Search
USPC .............................................. 333/5
See application file for complete search history.

(56) References Cited

U.S. PATENT DOCUMENTS

| | | | |
|---|---|---|---|
| 2006/0043604 A1* | 3/2006 | Suga | H01L 21/50 257/778 |
| 2007/0102830 A1* | 5/2007 | Muto | H05K 1/0219 257/784 |
| 2007/0126524 A1 | 6/2007 | Yagisawa | |
| 2011/0121922 A1* | 5/2011 | Blair | H01P 3/00 333/238 |
| 2012/0242421 A1* | 9/2012 | Robin | H01P 5/107 333/26 |

FOREIGN PATENT DOCUMENTS

| | | |
|---|---|---|
| JP | 2010-199277 A | 9/2010 |
| JP | 2012-151365 A | 8/2012 |
| JP | 2012-222079 A | 11/2012 |

* cited by examiner

CIRCUIT BOARD, ELECTRONIC COMPONENT HOUSING PACKAGE, AND ELECTRONIC DEVICE

TECHNICAL FIELD

The present invention relates to a circuit board for high-frequency signals, such as a printed circuit board or a flexible circuit board having an end connection that connects to an electrode terminal or wiring.

BACKGROUND ART

Examples of high-frequency circuit boards include a circuit board that uses a microstrip-type high-frequency line. The microstrip-type circuit board has a ground conductor formed on a back surface of a high-frequency signal line disposed on a front surface. These high-frequency circuit boards include an end connection portion (pad) for conducting a signal with an electrode of an electronic component or another circuit board.

FIG. 4 is a plan view illustrating an example of a circuit board 100 including a conventional microstrip line type differential signal line (refer to Patent Document 1, for example).

As illustrated in FIG. 4, a differential signal line 103 made of a pair of microstrip lines including a first microstrip line 101 and a second microstrip line 102 is formed on a front surface of the board 100. A ground conductor 104 (not illustrated) is formed on a back surface of the circuit board 100, in a corresponding portion in which the differential signal line 103 is formed.

Pads 101a, 102a which are wider than the first and second microstrip lines 101, 102 are formed on a terminating portion (lower portion in FIG. 4) of the circuit board 100. The pads 101a, 102a are provided to facilitate a connection. Then, the pads 101a, 102a are connected to an electrode or the like of an electronic component, thereby causing the circuit board 100 to transmit a high-frequency electric signal to or from the electronic component.

First and second relay lines 101b, 102b are provided to the differential signal line of Patent Document 1, extending between the first and second microstrip lines 101, 102 and the pads 101a, 102a. The first and second relay lines 101b, 102b have a line width that is less than the line width of the first and second microstrip lines 101, 102. In the pad 101a, 102a portions which have a wider line width, a high-frequency impedance decreases. The first and second relay lines 101b, 102b are provided to compensate for this decrease and improve high-frequency impedance matching.

CITATION LIST

Patent Literature

Patent Document 1: Japanese Unexamined Patent Application Publication No. 2012-151365A

SUMMARY OF INVENTION

Technical Problem

In a circuit board such as the example disclosed in Patent Document 1, when an electrode or the like of an electronic component is connected to the circuit board, the connection needs to be made so that the electrode of the electronic component faces the surface on which the first and second microstrip lines 101, 102 are provided. In this case, an electronic component or the like that is to be connected to another end side of the circuit board also needs to be disposed so that the electrode faces the same surface side.

Thus, the connection needs to be made by estimating the positions of the pads 101a, 102a of the microstrip lines 101, 102 from the back surface side of the circuit board, resulting in the problem that proper connection is not easily achieved.

In view of the above-described problems, an object of the present invention is to provide a circuit board having excellent high-frequency characteristics that allows connection of an electronic component or the like on a surface on a side opposite a surface on which a microstrip line is formed as well.

Solution to Problem

A circuit board of one embodiment of the present invention includes: a plate body made of a dielectric body and having a front surface and a back surface; a differential signal line formed on the front surface, the differential signal line being made of a pair of signal lines; and a ground conductor formed on the back surface. The ground conductor is formed on the back surface at a prescribed distance from one end of the plate body. The signal lines include: terminals formed at a distance from the ground conductor, in an end portion at a prescribed distance from the one end of the back surface; connection pads connected to the terminals and provided on an end portion of the front surface so as to be opposed to the terminals; transmission line units extending from the connections pads; and widened portions disposed in positions on the transmission line units corresponding to spaces between the terminals and the ground conductor, the widened portions having a line width greater than that of the transmission line units.

Further, according to the circuit board of one embodiment of the present invention, the widened portions are each provided so as to protrude toward a space between the pair of signal lines.

Further, according to the circuit board of one embodiment of the present invention, in the above-described circuit board, the widened portions have a rectangular shape.

An electronic device of one embodiment of the present invention is provided with any one of the above-described circuit boards, and an electronic component including a terminal plate with a connection conductor in a position corresponding to the terminals. In such an electronic device, the terminals are connected to the connection conductor of the terminal plate.

An electronic component housing package of one embodiment of the present invention includes: a container including a recess portion that houses an electronic component; and a terminal block provided to an outer wall portion of the container, the terminal block including a connection conductor that allows conduction of electricity between an inside and an outside of the container In such an electronic component housing package, any one of the above-described circuit boards is connected to the connection conductor of the terminal block.

An electronic device of one embodiment of the present invention is provided with the above-described electronic component housing package, and an electronic component housed and hermetically sealed in the recess portion, the electronic component being electrically connected to the connection conductor.

Advantageous Effects of Invention

According to the circuit board of one embodiment of the present invention, the terminals are provided in the end portion at the prescribed distance from the one end of the back surface, making it possible to connect an electrode of an electronic device or the like to a surface opposite to the surface on which the signal lines are formed.

Further, because the signal lines include the widened portions having a wider line width in positions corresponding to spaces between the ground conductor and the terminals of the transmission line units, it is possible to achieve excellent impedance matching.

Further, according to the circuit board of one embodiment of the present invention, the widened portions are provided so as to protrude toward a space between the pair of signal lines, making it possible to achieve low susceptibility to crosstalk between adjacent differential signal lines.

Furthermore, because the widened portions have a rectangular shape, the electronic device of one embodiment of the present invention can more easily achieve impedance matching.

The electronic device and the electronic component housing package of one embodiment of present invention are provided with any one of the above-described circuit boards, making it possible to more freely dispose the electrode and achieve excellent high-frequency characteristics.

DESCRIPTION OF EMBODIMENTS

Followings are description of a circuit board 10 according to one embodiment of the present invention, with reference to the drawings. It should be noted that each of the drawings is schematically illustrated, and actual dimensional relationships and detailed shapes may differ. Further, in the following description, terminology that refers to the top, bottom, left, right, front, and back is merely used to describe the positional relationship on the drawings, and does not signify the positional relationship during actual use.

Figure 1A:
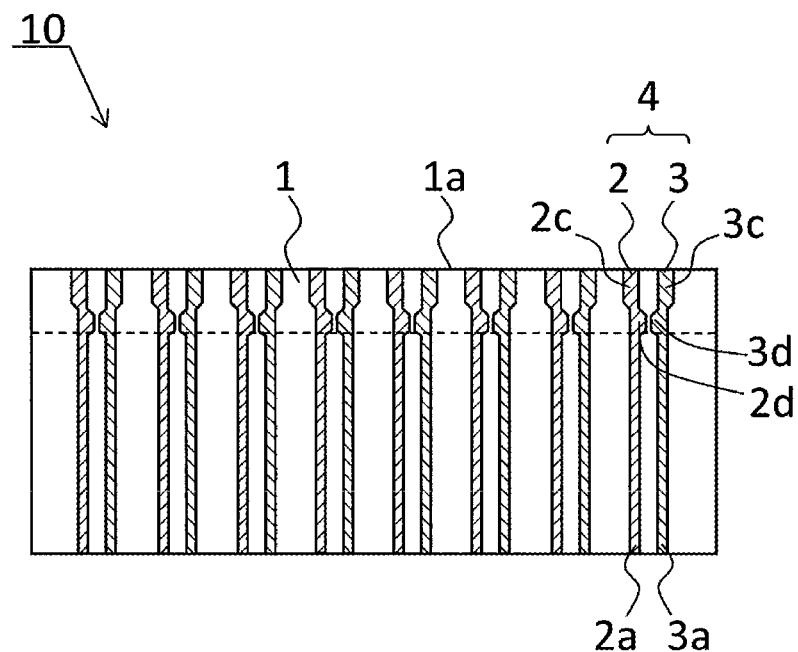
FIG. 1A is a plan view illustrating a circuit board according to one embodiment of the present invention, as viewed from a front surface.
Figure 1B:
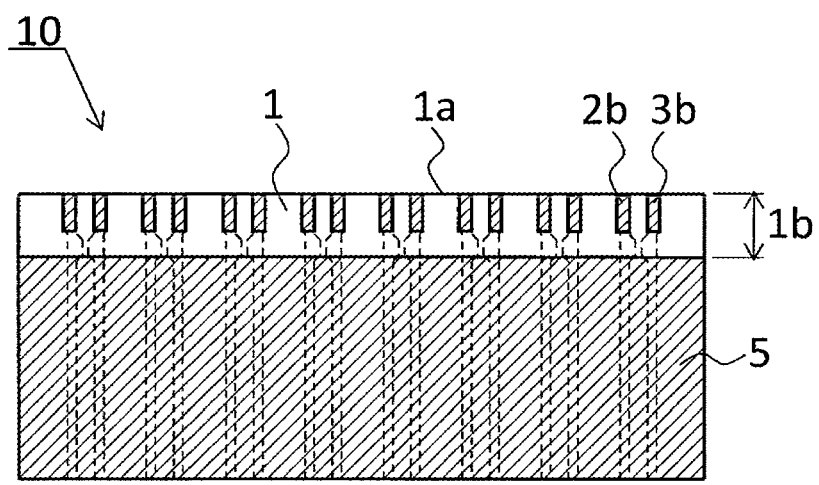
FIG. 1B is a plan view of the circuit board in FIG. 1A, as viewed from a back surface.

FIG. 1A and FIG. 1B are plan views illustrating the circuit board 10 of one embodiment of the present invention. FIG. 1A illustrates a front surface of the circuit board 10, and FIG. 1B illustrates a back surface, which is the opposite surface of the front surface. In these drawings, hatching is applied to conductor portions for ease of understanding. The hatching does not indicate cross-sections. Further, in FIGS. 1A and 1B, shapes of conductors on the opposite surface are indicated by dashed lines. The drawings illustrate an example of one end 1a portion, which is a main part of the circuit board, omitting the other end side and other portions. Further, while the drawings illustrate an example in which a differential signal line is used for a high-frequency signal line, the present invention is not limited thereto, allowing use of a microstrip line that uses a single standard high-frequency signal line, or the like.

As illustrated in FIG. 1A, a first signal line 2 and a second signal line 3 are formed on a front surface of a plate body 1 made of a dielectric body. The pair of first and second signal lines 2, 3 is formed so as to operate as a differential signal line 4. Further, a plurality of the differential signal lines 4 are formed side-by-side on the front surface of the plate body 1. Symbols for each portion are added to the rightmost differential signal line 4 of the plurality of differential signal lines 4 as a representative. The symbols for each portion are omitted from the other differential signal lines 4.

As illustrated in FIG. 1B, a ground conductor 5 is formed on a back surface of the plate body 1. The ground conductor 5 is formed at a predetermined distance 1b from the one end 1a of the plate body 1.

As understood from FIGS. 1A and 1B, the differential signal line 4 is formed so that the first signal line 2 and the second signal line 3 are symmetrically disposed with respect to an intermediate line between the two. Then, the first signal line 2 and the second signal line 3 have the same corresponding areas in left-right symmetry. Hence, the following describes each portion using the first signal line 2 as a representative. It should be noted that, in the following, each portion is referred to as simply "the signal line 2," "the signal line 3," or the like as well, without being prefixed with "first" or "second."

The signal line 2 includes a terminal 2b that is formed in a range of the predetermined distance 1b from the one end 1a on the back surface of the plate body 1. The terminal 2b is formed at a distance from the ground conductor 5 in an end portion at the predetermined distance 1b from the one end 1a of the plate body 1 on which the ground conductor 5 is not formed. The terminal 2b, which is at a distance from the ground conductor 5, is insulated from the ground conductor 5 and performs measurable high-frequency characteristics. The terminal 2b is formed in a rectangular shape that is wider than a transmission line unit 2a of the signal line 2. The formation of the terminal 2b with a wide width allows connection with an electrode of an electronic component or the like to be easily achieved. This also increases adhesion strength with respect to the plate body 1.

On the front surface of the plate body 1, a connection pad 2c of the signal line 2 is formed at the one end 1a. The connection pad 2c is formed so as to have a width that is greater than a line width of the transmission line unit 2a. The connection pad 2c is formed wider from the one end 1a of the plate body 1, making it possible to increase the adhesion strength with respect to the plate body 1. The connection pad 2c is provided to the one end 1a, where readily separates, making it possible to make one end of the signal line 2 less susceptible to separation.

The connection pad 2c is connected to a terminal 2b on the back surface via a through-hole conductor. The connection pad 2c is formed to have the same width and length corresponding to the width and length of the terminal 2b. With the connection pad 2c having the same width and length as those of the terminal 2b, it is possible to suppress a warp of the plate body 1 that occurs due to a difference in thermal expansion between the plate body 1 and the connection pad 2c as well as the terminal 2b. The connection pad 2c is provided for connecting the transmission line unit 2a and the terminal 2b, and therefore does not necessarily need to have the same width and the same length as those of the terminal 2b.

It should be noted that an electrode of an electronic component or the like may be connected to the connection pad 2c. The connection pad 2c is formed with a wide width, making it easy to connect the electrode of an electronic component or the like. Further, to avoid sudden changes in impedance, the connection pad 2c is formed in an inclined shape at the end connection with the transmission line unit 2a so as to gradually become thinner toward the transmission line unit 2a.

The connection pad 2c and the terminal 2b may be connected by an end surface conductor provided to the one end 1a surface instead of the through-hole conductor. Further, the end surface conductor and the through-hole conductor may be used in combination.

It should be noted that a side facing the signal line 3 of the connection pad 2c may be disposed near the signal line 3 in a range in which the connection pad 2c does not cause a significant mismatch with respect to the impedance of the differential signal line 4. According to such a disposition, it is possible to dispose adjacent differential signal lines 4a more closely and make the circuit board 10 compact.

Then, on the transmission line unit 2a extending from this connection pad 2c, a widened portion 2d for increasing the line width of the transmission line unit 2a is disposed in a position of the transmission line unit 2a on the front surface side corresponding to a portion between the ground conductor 5 and the terminal 2b in which a conductor is not formed on the back surface.

The ground conductor 5 is formed in a position at the prescribed distance 1b from the one end 1a, and capacity components that occur between the connection pad 2c as well as the transmission line unit 2a, and the ground conductor 5 formed in this portion decrease, thereby increasing impedance. In particular, a portion of the transmission line unit 2a corresponding to a portion in which a conductor between the terminal 2b and the ground conductor 5 is not formed tends to have high impedance. However, the widened portion 2d is disposed on the transmission line unit 2a, thereby decreasing the impedance of this portion and making it possible to avoid a significant mismatch with respect to impedance matching along the transmission line unit 2a.

The widened portion 2d in FIG. 1A is formed so as to protrude toward a space between the transmission line unit 2a and a transmission line unit 3a. Additionally, the widened portion 2d may be formed so as to protrude outward from the transmission line unit 2a and the transmission line unit 3a. Further, the widened portion 2d may be formed so as to protrude outward from both sides of the transmission line unit 2a and the transmission line unit 3a. The shape of the widened portion 2d may be any shape that suits the purpose of performing the impedance matching of the transmission line unit 2a and the transmission line unit 3a.

Nevertheless, as illustrated in FIG. 1A, the widened portion 2d is formed so as to protrude toward a space between the transmission line unit 2a and the transmission line unit 3a, which prevents the widened portion 2d from being formed near adjacent differential signal lines 4, and thus prevents capacitive coupling with respect to the adjacent differential signal lines 4 from increasing. As a result, it is possible to make crosstalk less likely to occur. As illustrated in FIG. 1A, in the case of the circuit board 10 in which the plurality of differential signal lines 4 are disposed, the widened portion 2d is preferably thus disposed between the transmission line 2 and the transmission line 3.

Further, the shape of the widened portion 2d is preferably rectangular. The rectangular shape allows the widened portion 2d to have a larger area within a limited space between the transmission line unit 2a and the transmission line unit 3a. Because the surface area can be increased, it is possible to secure a greater capacity by the widened portion 2d.

Furthermore, when the widened portion 2d is formed in a trapezoid shape having end portions inclined so as to become thinner toward the transmission line unit 2a, it is possible to make an impedance change along the differential signal line 4 gentle.

The signal line 2, the signal line 3, and the ground conductor 5 are formed by plating, printing, vaporizing, sintering, or the like a metal conductor made of copper, silver, manganese, molybdenum, or other metal or an alloy, on the front surface of the plate body 1.

A dielectric body, that is, an electrical insulation material is used for the plate body 1. A pliable material can also be used for the plate body 1. Specifically, it is possible to use an electrical insulation material generally used for a circuit board, such as a flexible board that uses polyimide resin or the like, an organic board that uses a resin such as epoxy resin, or a rigid circuit board that uses an inorganic material such as ceramic or glass, as the plate body 1.

A high-frequency line of an external circuit board is connected to the terminal 2b of the circuit board 10. For example, the circuit board 10 is connected to a terminal block of an electronic device or the like, and used as wiring to connect electronic devices to each other. A connection conductor that connects a high-frequency signal line is formed on the terminal block of the electronic device or the like, and the differential signal lines 4 of the circuit board 10 are connected to this connection conductor.

Figure 2:
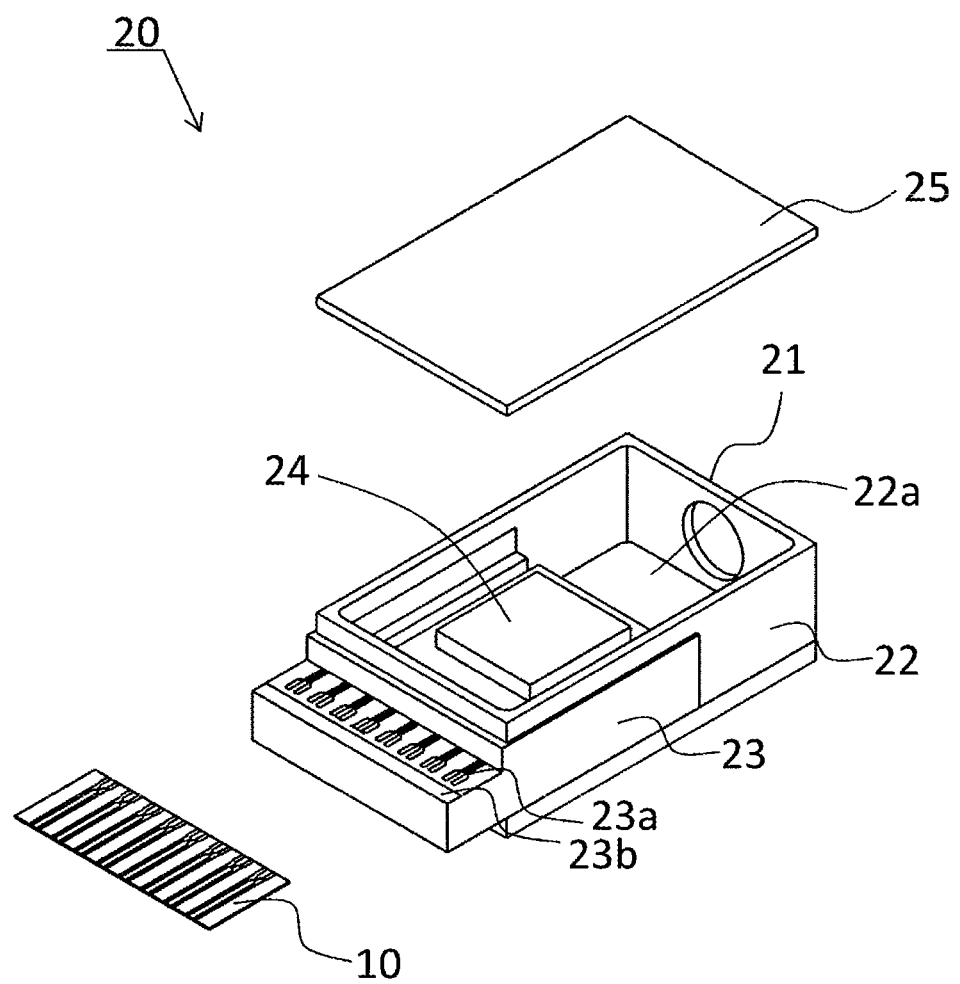
FIG. 2 is an exploded perspective view illustrating an electronic component housing package or an electronic device according to one embodiment of the present invention.
Figure 3:
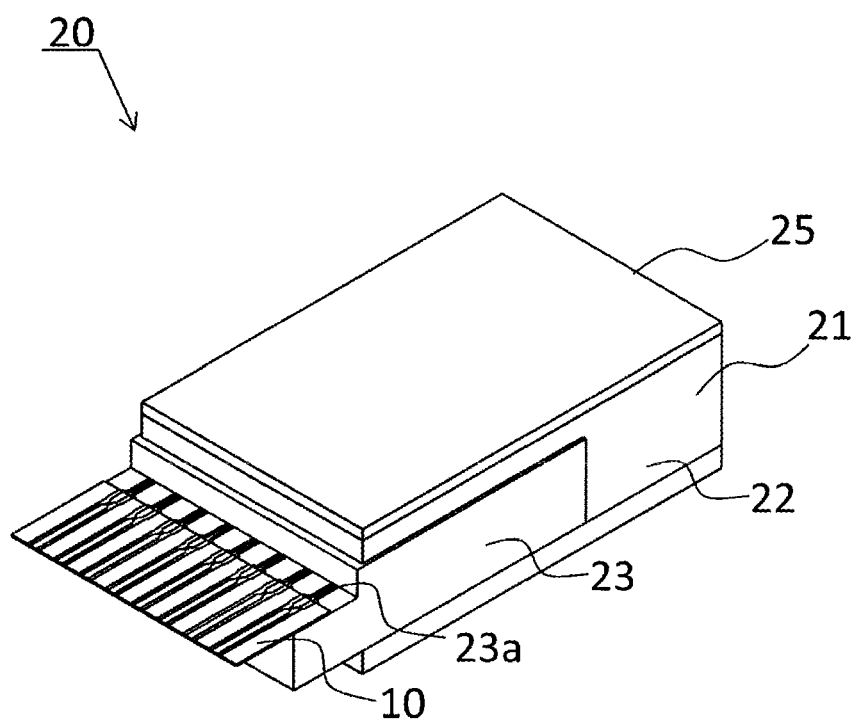
FIG. 3 is a perspective view illustrating the electronic component housing package or the electronic device according to one embodiment of the present invention.
Figure 4:
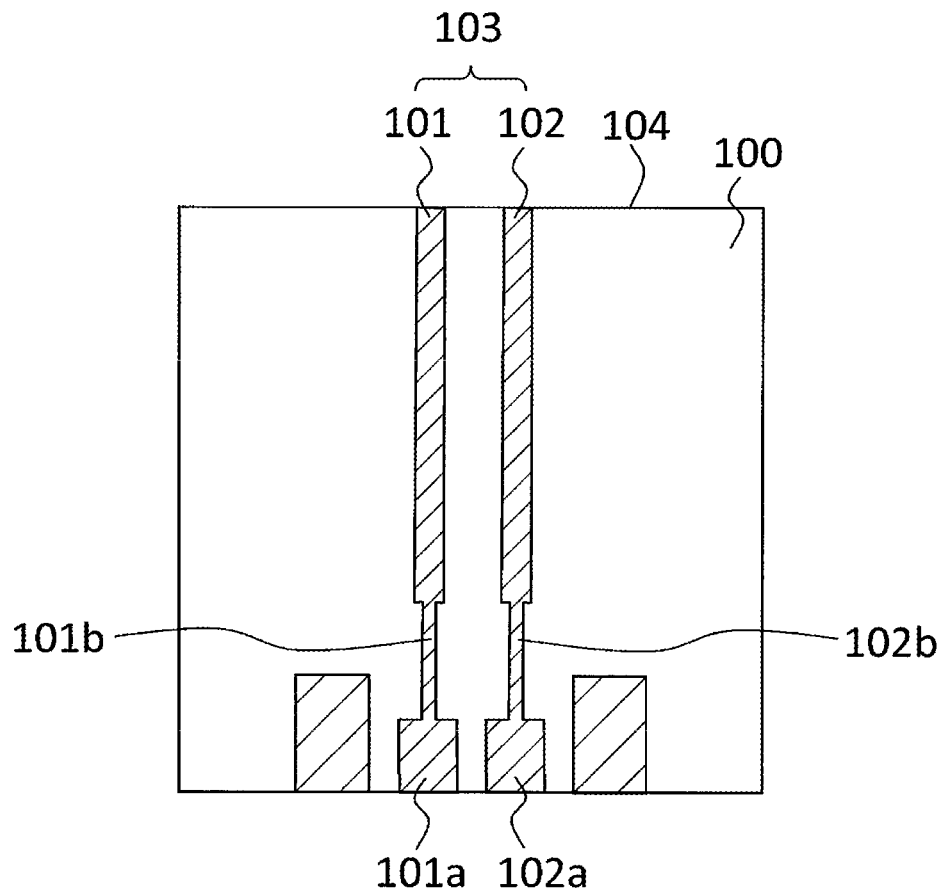
FIG. 4 is a plan view illustrating an example of a conventional circuit board, as viewed from a front surface of the circuit board.

As one example of this, FIGS. 2 and 3 illustrate a connection example of an electronic device 20 in which an electronic component 24 of a high-frequency semiconductor or the like is sealed in an electronic component housing package 21, and the circuit board 10. FIG. 2 illustrates an exploded perspective view of the electronic device 20. FIG. 3 illustrates a perspective view of the electronic device 20.

In the electronic component housing package 21 serving as one example, a container 22 is formed by a metal such as an iron-nickel-cobalt alloy, or a ceramic material including alumina ceramic. The container 22 includes a recess portion 22a having an opening in a top surface. Further, a terminal block 23 that includes connection conductors 23a, which are made of ceramic such as alumina ceramic and connect the inside and the outside of the electronic component housing package 21, is attached so as to pass through one side wall of the container 22.

As illustrated in FIG. 2, the terminals 2b of the circuit board 10 are connected by soldering or the like to the respective connection conductors 23a provided to the terminal block 23 of the electronic component housing package 21. Similarly, the ground conductor 5 of the circuit board 10 is connected by soldering or the like to the ground conductor 23b of the terminal block 23. Such a connection causes the electronic component housing package 21 to connect with the circuit board 10.

It should be noted that the widened portion 2d is provided in a position that does not overlap with the ground conductor 23b when viewing the electronic component housing package 21 in a plan view. Accordingly, it is possible to lessen the decrease in the capacity component between the widened portion 2d and the ground conductor 23b at the prescribed distance 1b from the one end 1a of the signal line 2. As a result, it is possible to avoid a significant mismatch with respect to impedance matching.

Then, the electronic component 24 is placed inside the recess portion 22a of the electronic component housing package 21, and an electrode of the electronic component 24 is electrically connected to the connection conductor 23a. Subsequently, a lid 25 is bonded to the container 22 so as to cover the recess portion 22a, thereby hermetically sealing the electronic component. The electronic device 20 is thus completed.

The electronic component 24 inside the electronic component housing package 21 and an external circuit are connected using the circuit board 10, thereby improving the high-frequency characteristics of the end connection of the circuit board 10. Then, the electronic device 20 having good performance can be obtained. Further, it is possible to connect the connection conductors 23a of the terminal block 23 to the terminals 2b provided on the back surface of the circuit board 10.

Examples

The plate body 1 including the differential signal lines 4 illustrated in FIG. 1A on the front surface and the ground conductor 5 illustrated in FIG. 1B on the back surface was manufactured. The plate body 1 was formed by cutting out a dielectric body which is made of 0.075 mm-thickness polyimide and has dimensions of 12 mm (width)×5 mm (length). This plate body 1 was plated with copper, and the line conductors 2, 3, the ground conductor 5, and through-vias for electrically connecting the signal lines 2, 3, and the ground conductor 5 were formed by pattern etching.

One set of differential signal lines 4 was formed in a width direction of this front surface. In the one set of differential signal lines 4, the line width of the signal lines 2, 3 was set to 0.2 mm, the line length was set to 5 mm, and the line interval between the signal lines 2a, 3a was set to 0.25 mm. Then, the connection pads 2c, 3c having dimensions of 0.23 mm (width)×1 mm (length) were provided to the one end 1a of the signal lines 2, 3, and the widened portions 2d, 3d were provided between the signal lines 2,3 adjacent to the connection pads 2c, 3c. The widened portions 2d, 3d had an isosceles trapezoidal shape, with a 0.24 mm lower base, an 0.12 mm upper base, and a 0.08 mm height. It should be noted that the sides of the connection pads 2c, 3c adjacent to the widened portions 2d, 3d were inclined at the same angle as legs of the widened portions 2d, 3d.

Then, the ground conductor 5 was formed in a portion excluding the 1.25 mm prescribed distance 1b from the one end 1a, on the back surface of the plate body 1. Then, the terminals 2b, 3b having dimensions of 0.23 mm (width)×1 mm (length) were formed in positions opposite the connection pads 2c, 3c. The terminals 2b, 3b were connected to the connection pads 2c, 3c by the through-vias.

Figure 5A:
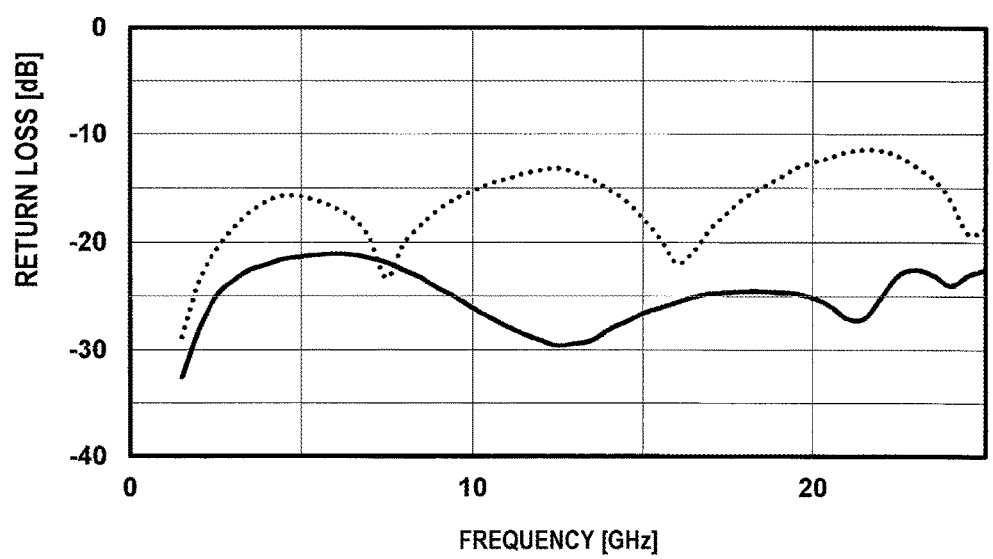
FIG. 5A is a chart showing return losses of the circuit board according to one embodiment of the present invention and a conventional example.
Figure 5B:
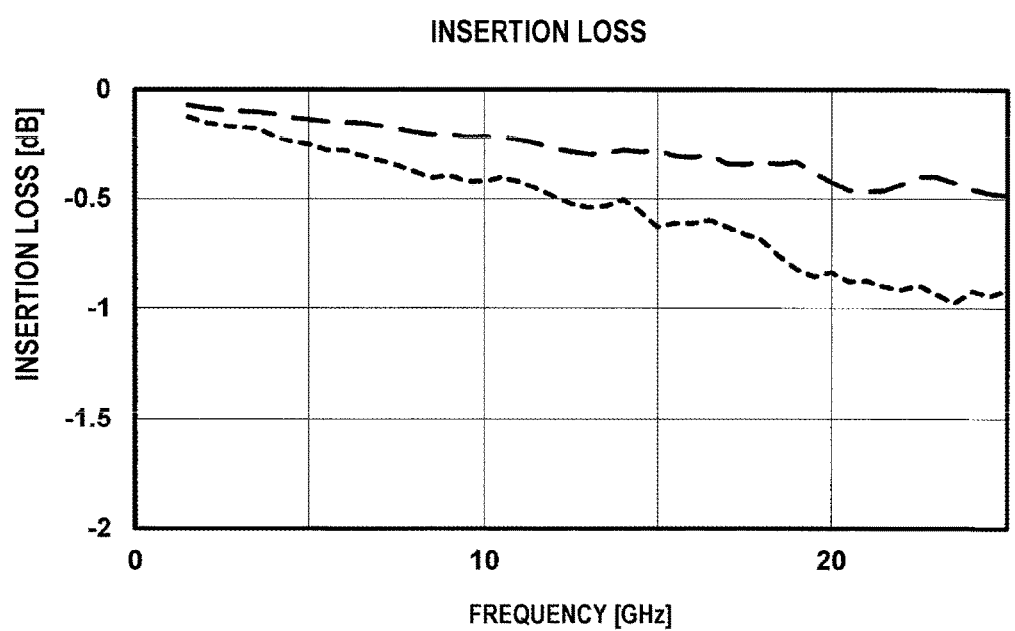
FIG. 5B is a chart showing insertion losses of the circuit board according to one embodiment of the present invention and the conventional example.

FIG. 5A and FIG. 5B are graphs showing the results of simulating the frequency characteristics of the plate body 1 according to the present embodiment. FIG. 5A shows the return loss as viewed from one end side of the signal lines 2, 3, and FIG. 5B shows the insertion loss. In FIG. 5A, the return loss of the present embodiment is indicated by a solid line, and the return loss of a comparative example is indicated by a dotted line. Further, in FIG. 5B, the insertion loss of the present embodiment is indicated by a long dashed line, and a transmission insertion loss of the comparative example is indicated by a dashed line.

It should be noted that the simulation of the present embodiment is based on a structure in which the widened portions 2d, 3d were provided so as to protrude a space between the transmission line unit 2a and the transmission line unit 3a, as illustrated in FIG. 1A. On the other hand, the comparative example is based on a structure in which there are no widened portions 2d, 3d between the transmission line unit 2a and the transmission line unit 3a.

As illustrated in FIG. 5A, when the widened portions 2d, 3d illustrated in the present embodiment exist, the return loss is improved by 13 db at, for example, 20 GHz over the comparative example.

Further, as illustrated in FIG. 5B, when the widened portions 2d, 3d illustrated in the present embodiment exist, the insertion loss is improved by 0.4 db over the comparative example at 20 GHz, for example.

It should be noted that the present invention is not limited to the aforementioned embodiment, and rather allows for a variety of modifications and changes without departing from the spirit of the present invention.

For example, while the differential signal line 4 is made of the signal line 2 and the signal line 3, each having a microstrip shape, in the present embodiment, a ground conductor layer may be formed between the differential signal lines 4 that are adjacent to each other. Furthermore, a ground conductor layer may be provided between the signal line 2 and the signal line 3, making the signal line 2 and the signal line 3 coplanar.

Further, while an example of the circuit board 10 made of the plurality of differential signal lines 4 and the ground conductor 5 is illustrated in the present embodiment, only one set of the differential signal lines 4 is also acceptable.

REFERENCE SIGNS LIST

1 Plate body
1a One end
1b Prescribed distance
2 Signal line
2a Transmission line unit
2b Terminal
2c Connection pad
2d Widened portion
3 Signal line
3a Transmission line unit
3b Terminal
3c Connection pad
3d Widened portion
4 Differential signal line
5 Ground conductor
10 Circuit board
20 Electronic device
21 Electronic component housing package
22 Container
22a Recess portion
23 Terminal block
23a Connection conductor
23b Ground conductor
24 Electronic component
25 Lid

The invention claimed is:

1. A circuit board comprising:
  a plate body comprising a dielectric body, the plate body including a front surface and a back surface;
  a differential signal line located on the front surface, the differential signal line comprising a pair of signal lines; and a ground conductor located on the back surface, the ground conductor being located on the back surface at a prescribed distance from one end of the plate body; and the pair of signal lines including:

terminals located at a distance from the ground conductor, in an end portion at a prescribed distance from the one end of the back surface;

connection pads connected to the terminals and located on an end portion of the front surface opposed to the terminals;

transmission line units extending from the connection pads; and widened portions disposed in positions on the transmission line units on the front surface and a conductor free region on the back surface extending continuously (i) from a first position on the back surface, corresponding to a widened portion of a first transmission line unit on the front surface, (ii) to a second position on the back surface, corresponding to a widened portion of a second transmission line unit on the front surface and extending between the terminals and the ground conductor, the widened portions having a line width greater than that of the transmission line units, the conductor free region overlapping the widened portions from edges of the widened portions facing the connection pads to opposing edges of the widened portions, wherein a plurality of the differential signal lines are formed side-by-side on the front surface of the plate body, and the widened portions are located protruding only toward a space between the pair of signal lines.

2. An electronic component housing package comprising:
a container including a recess portion that houses an electronic component; and
a terminal block provided to an outer wall portion of the container, the terminal block including a connection conductor that allows conduction of electricity between an inside and an outside of the container;
the circuit board described in claim 1 being connected to the connection conductor of the terminal block.

3. An electronic device comprising:
the electronic component housing package described in claim 2; and
an electronic component housed and hermetically sealed in the recess portion, the electronic component being electrically connected to the connection conductor.

4. The circuit board according to claim 1, wherein the widened portions have a rectangular shape.

5. An electronic device comprising:
the circuit board described in claim 1; and
an electronic component including a terminal plate with a connection conductor in a position corresponding to the terminals;
the terminals being connected to the connection conductor of the terminal plate.

6. The circuit board according to claim 1, wherein the widened portions are each formed into a trapezoid shape having end portions which are inclined so as to be thinner toward the transmission line units.

7. The circuit board according to claim 1, wherein each of the connection pads protrudes toward a side opposite to each of the widened portions, and a width of the connection pad is greater than a width of the signal line corresponding thereto.

8. A circuit board comprising:
a plate body comprising a dielectric body, the plate body including a front surface and a back surface;
a differential signal line located on the front surface, the differential signal line comprising a pair of signal lines; and
a ground conductor located on the back surface, the ground conductor being located on the back surface at a prescribed distance from one end of the plate body; and the pair of signal lines including:

terminals located at a distance from the ground conductor, in an end portion at a prescribed distance from the one end of the back surface;

connection pads connected to the terminals and located on an end portion of the front surface opposed to the terminals;

transmission line units extending from the connection pads; and widened portions disposed in positions on the transmission line units on the front surface corresponding to a region on the back surface that is absent any ground conductors and extends across a width of the plate body, the widened portions having a line width greater than that of the transmission line units, the region on the back surface that is absent any ground conductors overlapping the widened portions from edges of the widened portions facing the connection pads to opposing edges of the widened portions, wherein a plurality of the differential signal lines are formed side-by-side on the front surface of the plate body, and the widened portions are located protruding only toward a space between the pair of signal lines.

* * * * *